(12) United States Patent
Nakamori

(10) Patent No.: US 10,680,509 B2
(45) Date of Patent: Jun. 9, 2020

(54) CURRENT DETECTION DEVICE FOR POWER SEMICONDUCTOR ELEMENT

(71) Applicant: FUJI ELECTRIC CO., LTD., Kawasaki-shi, Kanagawa (JP)

(72) Inventor: Akira Nakamori, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 339 days.

(21) Appl. No.: 15/198,880

(22) Filed: Jun. 30, 2016

(65) Prior Publication Data

US 2016/0315531 A1    Oct. 27, 2016

Related U.S. Application Data

(63) Continuation of application No. PCT/JP2015/063028, filed on Apr. 30, 2015.

(30) Foreign Application Priority Data

Jun. 30, 2014  (JP) .................................. 2014-134870

(51) Int. Cl.
| | |
|---|---|
| *H02M 1/32* | (2007.01) |
| *G01R 19/00* | (2006.01) |
| *G01R 17/16* | (2006.01) |
| *H01L 29/739* | (2006.01) |

(52) U.S. Cl.
CPC .............. *H02M 1/32* (2013.01); *G01R 17/16* (2013.01); *G01R 19/0092* (2013.01); (Continued)

(58) Field of Classification Search
CPC ........... H02M 1/32; H02M 2001/0009; H02M 2001/0029; H02M 2001/0054; H02M 1/088; H02M 1/08; H02M 7/5387; H02M 7/53871; H02M 3/156; H02M 3/158; H02M 3/1588; H02M 7/537; G01R 17/16; G01R 19/0092; G01R 31/42; H01L 29/7393; H03K 17/08128; H03K 2217/0072;

(Continued)

(56) References Cited

U.S. PATENT DOCUMENTS 9,356,580 B2 * 5/2016 Mori ..................... H02M 1/088
2002/0141126 A1 * 10/2002 Tabata ............... H03K 17/0828
361/93.7

(Continued)

FOREIGN PATENT DOCUMENTS

| JP | 2012-186899 A | 9/2012 |
| JP | 2013-169030 A | 8/2013 |
| WO | WO-2013/094148 A1 | 6/2013 |

*Primary Examiner* — Lee E Rodak
(74) *Attorney, Agent, or Firm* — Rabin & Berdo, P.C.

(57) ABSTRACT

A current detection device for a power semiconductor element includes an operational amplifier that fixes an emitter terminal of a sense IGBT to a voltage equal to or smaller than 1 volt of a reference voltage supply, and a current-voltage converter configured to flow in a resistor a current that is greater than and proportional to a current that flows into the operational amplifier from the sense IGBT. The current-voltage converter includes an NMOS transistor that operates with reference to an electric potential of a ground and a resistor provided at a high side of the NMOS transistor, in order to operate from the electric potential of the ground.

8 Claims, 3 Drawing Sheets

(51) Int. Cl.
  *H03K 17/0812* (2006.01)
  *H02M 1/00* (2006.01)
  *G01R 31/42* (2006.01)

(52) U.S. Cl.
  CPC ... *H01L 29/7393* (2013.01); *H03K 17/08128* (2013.01); *G01R 31/42* (2013.01); *H02M 2001/0009* (2013.01); *H03K 2217/0027* (2013.01); *H03K 2217/0072* (2013.01)

(58) Field of Classification Search
  CPC ....... H03K 2217/0027; H03K 17/0828; H03K 17/567; H03K 17/687; H03K 17/127; H03K 17/163; H03K 17/168; H03K 17/18; H03K 17/14; H03K 17/6887; H03K 17/0406; H03K 17/0822; H03K 17/16; H03K 17/145; H03K 17/167; H03K 17/30; H03K 17/60; H03K 17/689; H03K 17/74; H03K 2217/0036; H03K 3/012; H03K 19/001; H03K 2017/0806; H03K 2217/0063; H03K 2217/0081; H03K 5/08
  See application file for complete search history.

(56) References Cited

U.S. PATENT DOCUMENTS

| | | | |
|---|---|---|---|
| 2003/0146493 A1* | 8/2003 | Tomomatsu | H01L 27/0647 257/566 |
| 2004/0178809 A1* | 9/2004 | Fujino | H02M 7/537 324/710 |
| 2007/0096825 A1* | 5/2007 | Okuyama | H03F 1/08 330/292 |
| 2007/0262761 A1* | 11/2007 | Ishigaki | H02M 3/156 323/282 |
| 2008/0100978 A1* | 5/2008 | Maebara | H03K 17/0828 361/93.8 |
| 2012/0126858 A1* | 5/2012 | Senda | H03K 17/0406 327/108 |
| 2012/0224288 A1 | 9/2012 | Uota et al. | |
| 2014/0334051 A1 | 11/2014 | Yagyu et al. | |
| 2014/0347078 A1* | 11/2014 | Qin | G01R 19/0092 324/713 |
| 2016/0349289 A1* | 12/2016 | Sievert | G01R 19/0092 |

* cited by examiner

CURRENT DETECTION DEVICE FOR POWER SEMICONDUCTOR ELEMENT

CROSS-REFERENCE TO RELATED APPLICATION

This application is a continuation application of International Application PCT/JP2015/063028 filed on Apr. 30, 2015 which designated the U.S., which claims priority to Japanese Patent Application No. 2014-134870, filed on Jun. 30, 2014, the entire contents of which are incorporated herein by reference.

BACKGROUND OF THE INVENTION

1. Field of the Invention

The embodiments discussed herein relate to a current detection device for a power semiconductor element, and particularly to a current detection device for a power semiconductor element including a main element in which a main current flows and a current sense element for detecting the current of this main element.

2. Background of the Related Art

An electric power converter device, such as an inverter device for driving an electric motor and an uninterruptible power supply device for a computer, switches a power semiconductor element to perform electric power conversion. The electric power converter device needs to protect the device against a short circuit trouble that occurs suddenly outside the device, in order to prevent destruction of the device. To include this function in the electric power converter device, the electric power converter device has a function for continuously detecting current that flows in a semiconductor element of the electric power converter device.

FIG. 2 is a circuit diagram illustrating a power semiconductor element and a conventional first current detection circuit. This circuit diagram illustrates an example in which a power semiconductor element 100 of an electric power converter device is an insulated gate bipolar transistor (IGBT). Note that the power semiconductor element 100 is not limited to the illustrated IGBT, but may be other insulated gate semiconductor elements, such as an insulated gate field-effect transistor.

The power semiconductor element 100 includes an IGBT 101 which is a main element in which a main current flows and a sense IGBT 102 which is a current sense element for detecting the current of this IGBT 101. This sense IGBT 102 has the same structure as the IGBT 101 and has a smaller size than the IGBT 101. The power semiconductor element 100 has a configuration in which the IGBT 101 and the sense IGBT 102 are connected to each other to have a common gate terminal 103 and a common collector terminal 104. The gate terminal 103 is connected to a drive circuit of this power semiconductor element 100, and the collector terminal 104 is connected to a power supply via a load, such as an electric motor. Also, in the power semiconductor element 100, an emitter terminal 105 of the IGBT 101 and an emitter terminal 106 of the sense IGBT 102 are configured independently. The emitter terminal 105 of the IGBT 101 is connected to a ground 107, and the emitter terminal 106 of the sense IGBT 102 is connected to one end of a resistor 108, and another end of the resistor 108 is connected to the ground 107.

In a control state in which the power semiconductor element 100 is turned on, the current that flows in the emitter terminal 105 of the IGBT 101 is greater than and proportional to the current that flows in the emitter terminal 106 of the sense IGBT 102. In this case, the current that flows in the emitter terminal 106 of the sense IGBT 102 flows in the resistor 108 as it is, and thus this resistor 108 generates a voltage drop that is proportional to the current that flows in the emitter terminal 105 of the IGBT 101. A circuit (not depicted) for measuring this voltage drop is connected to the resistor 108, and the circuit measures the voltage drop to indirectly detect the current that flows in the IGBT 101.

In current detection by the configuration of the above FIG. 2, there are two known problems in deciding the size of the resistor 108, i.e., a first problem relevant to current detection accuracy and a second problem relevant to erroneous operation due to disturbance noise.

The first problem relevant to current detection accuracy is that, as the resistance value of the resistor 108 increases, its voltage drop increases, and thus the voltage between the gate and the emitter of the IGBT 101 becomes significantly different from the voltage between the gate and the emitter of the sense IGBT 102. If the voltages between the gates and the emitters of the IGBT 101 and the sense IGBT 102 are different from each other, accuracy of the current rate between the current that flows in the IGBT 101 and the current that flows in the sense IGBT 102 deteriorates, and thus current detection accuracy deteriorates.

The second problem relevant to erroneous operation due to disturbance noise is that, as the resistance value of the resistor 108 decreases, its voltage drop decreases, and the above current detection accuracy improves, but a threshold value to determine overcurrent at the time of short circuit becomes small, and thus erroneous operation due to disturbance noise is likely to occur.

The above first and second problems and means for solving these problems are already proposed (for example, Japanese Laid-open Patent Publication No. 2012-186899 (paragraphs [0017] to [0041] and FIG. 1)), and thus the current detection proposed here will be described.

FIG. 3 is a circuit diagram illustrating a power semiconductor element and a conventional second current detection circuit. Note that, in FIG. 3, components that are same as or equivalent to what are described in FIG. 2 are denoted with the same reference signs.

In the power semiconductor element 100, a free-wheeling diode 109 is connected in inverse parallel to a collector terminal 104 and an emitter terminal 105 of an IGBT 101. The emitter terminal 105 of the IGBT 101 is connected to a ground 107 having a ground potential.

The power semiconductor element 100 is configured to be controlled by a drive control circuit 110. The drive control circuit 110 includes a drive circuit 120 connected to a gate terminal 103 of the power semiconductor element 100, an overcurrent determination circuit 130, and a current detection circuit 140 that detects current that flows in a sense IGBT 102.

The drive circuit 120 includes a driver 121 and direct current power supplies 122 and 123, and the driver 121 drives and controls the power semiconductor element 100 by using the direct current power supply 122 as a drive power supply. A negative electrode of the direct current power supply 122 is connected to a common connection part 111 of the drive control circuit 110 to provide a reference potential of the drive control circuit 110. With regard to the direct current power supply 123, a positive electrode is connected to the ground 107 of the ground potential, and a negative electrode is connected to the common connection part 111 of the reference potential of the drive control circuit 110.

The current detection circuit 140 includes a PNP transistor 141 and a resistor 108. With regard to the PNP transistor 141, an emitter terminal is connected to an emitter terminal 106 of the sense IGBT 102, and a collector terminal is connected to one end of the resistor 108, and a base terminal is connected to the ground 107 of the ground potential. Another end of the resistor 108 is connected to the common connection part 111 of the reference potential of the drive control circuit 110.

The overcurrent determination circuit 130 includes a comparator 131 and a direct current power supply 132. With regard to the comparator 131, one of input terminals is connected to a connection point between the collector terminal of the PNP transistor 141 and the resistor 108 in the current detection circuit 140, and the other of input terminals is connected to a positive electrode of the direct current power supply 132. A negative electrode of the direct current power supply 132 is connected to the common connection part 111 of the drive control circuit 110. Thereby, the comparator 131 compares an electric potential difference Vs of the resistor 108 relative to the common connection part 111 with the voltage of the direct current power supply 132, and determines that overcurrent has flowed in the IGBT 101 of the power semiconductor element 100 when the electric potential difference Vs exceeds the voltage of the direct current power supply 132.

According to the current detection circuit 140 of this drive control circuit 110, when the power semiconductor element 100 is turned on to flow current in the sense IGBT 102, the PNP transistor 141 of the current detection circuit 140 is also turned on. When the PNP transistor 141 is turned on, the voltage between the base and the emitter of the PNP transistor 141 becomes approximately equal to forward voltage drop of one piece of diode. Hence, the emitter terminal of the sense IGBT 102 is substantially fixed to the electric potential of the forward voltage drop of one piece of diode relative to the ground potential of the ground 107, and the voltages between the gates and the emitters of the IGBT 101 and the sense IGBT 102 are not substantially different from each other. Accuracy of the current rate between the current that flows in the IGBT 101 and the current that flows in the sense IGBT 102 does not change significantly, and thus the current detection accuracy does not deteriorate, so as to solve the above first problem.

Also, the above second problem is solved in the same way, because the reference potential of the resistor 108 is set to a lower electric potential than the ground potential of the ground 107 by using the direct current power supply 123, allowing a larger voltage drop of the resistor 108.

Here, the power supply for operating the current detection circuit 140 is −V2 to (V1−V2), where V1 is a voltage of the direct current power supply 122 illustrated in FIG. 3, and V2 is a voltage of the direct current power supply 123. Hence, the current detection circuit 140 needs to be operated from a negative voltage, which imposes a problem of complicated system design on the drive control circuit 110.

SUMMARY OF THE INVENTION

According to one aspect, there is provided a current detection device for a power semiconductor element including a main element in which a main current flows and a current sense element for detecting the main current of the main element, the current detection device including: a reference voltage supply configured to output a predetermined reference voltage; an operational amplifier including a non-inverting input terminal, an inverting input terminal, and an output terminal, wherein the reference voltage is applied to the non-inverting input terminal, and the inverting input terminal is connected to the output terminal and a current output terminal of the current sense element; and a current-voltage converter configured to convert current that flows in an output stage device included in an output stage of the operational amplifier to voltage, wherein the reference voltage supply, the operational amplifier, and the current-voltage converter are configured to operate with reference to an electric potential of a ground.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
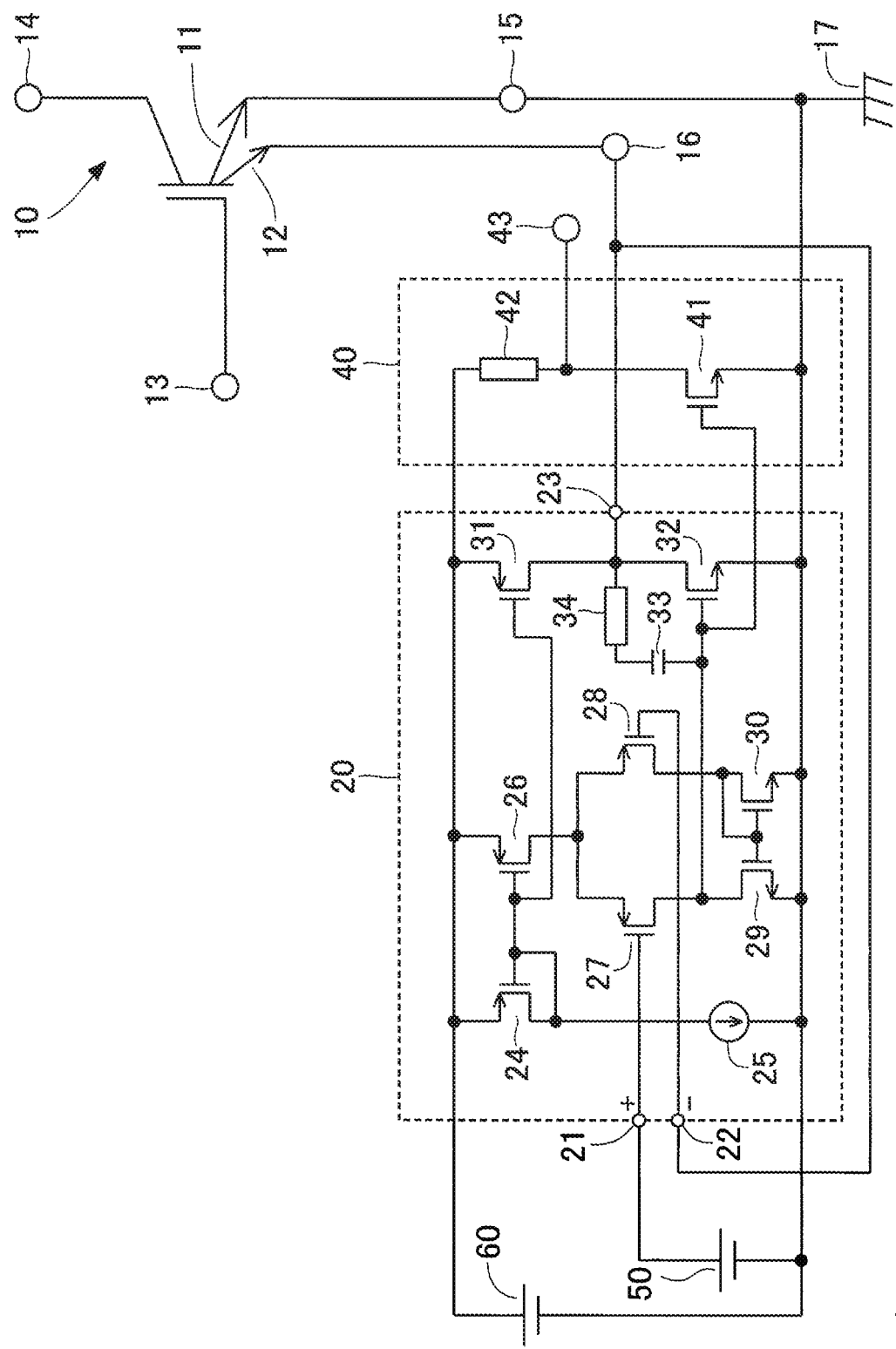
FIG. 1 is a circuit diagram illustrating one exemplary configuration of a current detection device for a power semiconductor element according to an embodiment of the present disclosure.
Figure 2:
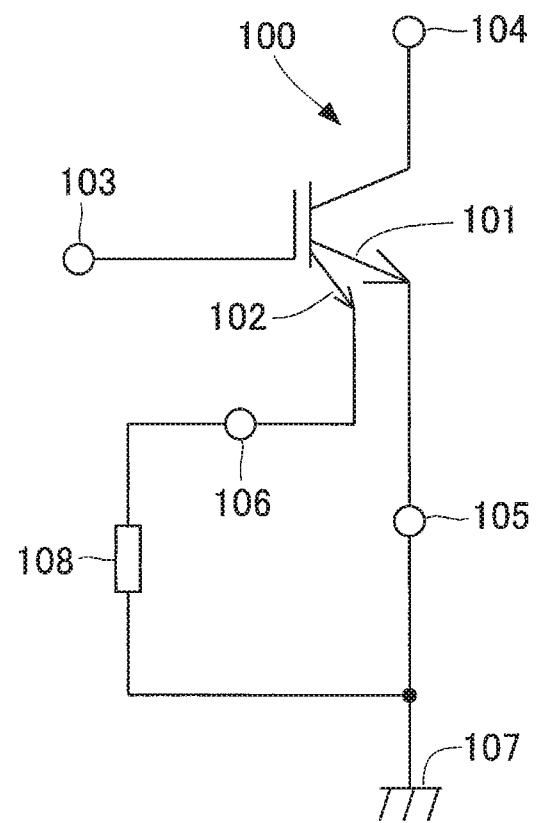
FIG. 2 is a circuit diagram illustrating a power semiconductor element and a conventional first current detection circuit.
Figure 3:
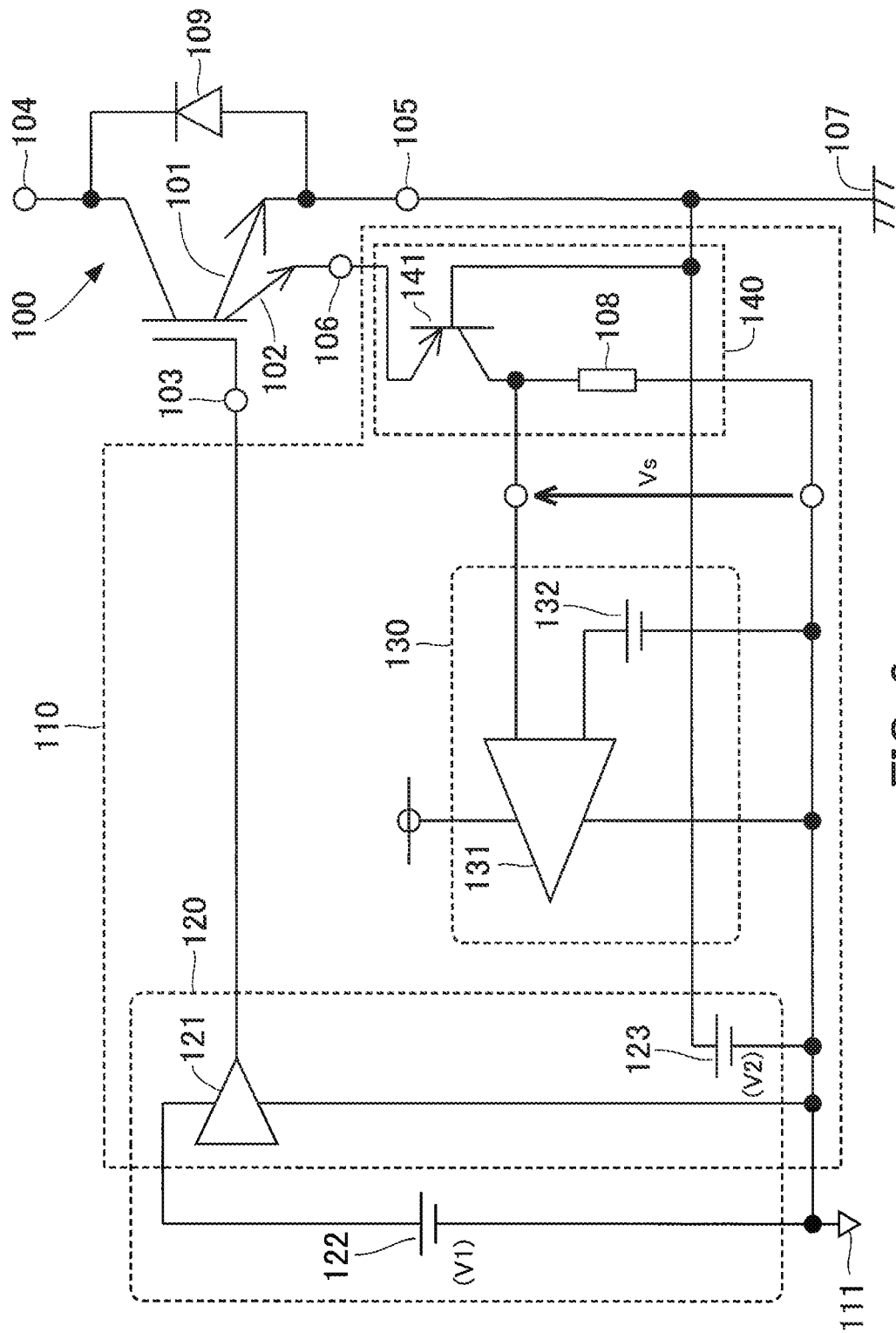
FIG. 3 is a circuit diagram illustrating a power semiconductor element and a conventional second current detection circuit.

An embodiment will be described below with reference to the accompanying drawings, wherein like reference numerals refer to like elements throughout. In the following, an embodiment of the present disclosure will be described in detail with reference to a drawing illustrating an example that employs an IGBT including a sense IGBT as a power semiconductor element.

FIG. 1 is a circuit diagram illustrating one exemplary configuration of a current detection device for a power semiconductor element according to an embodiment of the present disclosure.

A power semiconductor element 10 includes an insulated-gate bipolar transistor (IGBT) 11 which is a main element in which main current flows and a sense IGBT 12 which is a current sense element for detecting current of the IGBT 11. This sense IGBT 12 has the same structure as the IGBT 11 and has a smaller size than the IGBT 11 to divide a part of the current that flows in the IGBT 11.

The IGBT 11 and the sense IGBT 12 are connected to each other to have a common gate terminal 13 and a common collector terminal 14. The gate terminal 13 is connected to a drive circuit of this power semiconductor element 10, and the collector terminal 14 is connected to a power supply via a load. An emitter terminal 15 of the IGBT 11 and an emitter terminal 16 which is a current output terminal of the sense IGBT 12 are constructed independently. The emitter terminal 15 of the IGBT 11 is connected to a ground 17 of a ground potential, and the emitter terminal 16 of the sense IGBT 12 is connected to the current detection device for the power semiconductor element 10.

The current detection device includes an operational amplifier 20, a current-voltage converter 40, a reference voltage supply 50, and a voltage supply 60. The reference voltage supply 50 is used to fix the emitter terminal 16 of the sense IGBT 12 to a predetermined voltage close to the ground potential (0 volt), and is set at a voltage of 1 volt or less, preferably approximately 0.6 volt.

The operational amplifier 20 includes a non-inverting input terminal 21, an inverting input terminal 22, and an output terminal 23. The non-inverting input terminal 21 of the operational amplifier 20 is connected to a positive electrode of the reference voltage supply 50, and the negative electrode of the reference voltage supply 50 is connected to the ground 17 of the ground potential. The inverting input terminal 22 of the operational amplifier 20 is connected to the output terminal 23 and the emitter terminal 16 of the sense IGBT 12.

The voltage supply 60 is connected to the operational amplifier 20, and a positive electrode of the voltage supply 60 is connected to a source terminal of a P-channel metal-oxide semiconductor (PMOS) transistor 24. A drain terminal of the PMOS transistor 24 is connected to a negative electrode of the voltage supply 60 and the ground 17 via a current source 25. A gate terminal of the PMOS transistor 24 is connected to the drain terminal of itself and a gate terminal of a PMOS transistor 26. A source terminal of the PMOS transistor 26 is connected to the positive electrode of the voltage supply 60, and a drain terminal is connected to each of source terminals of PMOS transistors 27 and 28. A gate terminal of the PMOS transistor 27 is connected to the non-inverting input terminal 21 of the operational amplifier 20, and a gate terminal of the PMOS transistor 28 is connected to the inverting input terminal 22. A drain terminal of the PMOS transistor 27 is connected to a drain terminal of an N-channel metal-oxide semiconductor (NMOS) transistor 29, and a source terminal of the NMOS transistor 29 is connected to the ground 17. A drain terminal of the PMOS transistor 28 is connected to a drain terminal of an NMOS transistor 30, and a source terminal of the NMOS transistor 30 is connected to the ground 17. A gate terminal of the NMOS transistor 29 is connected to a gate terminal and a drain terminal of the NMOS transistor 30.

Also, the gate terminal and the drain terminal of the PMOS transistor 24 are connected to a gate terminal of a PMOS transistor 31. A source terminal of the PMOS transistor 31 is connected to the positive electrode of the voltage supply 60, and a drain terminal is connected to a drain terminal of an NMOS transistor 32. A source terminal of the NMOS transistor 32 is connected to the ground 17, and a gate terminal is connected to a connection point between the drain terminal of the PMOS transistor 27 and the drain terminal of the NMOS transistor 29. A connection point between the drain terminal of the PMOS transistor 31 and the drain terminal of the NMOS transistor 32 is connected to the output terminal 23 of the operational amplifier 20. A series circuit of a capacitor 33 and a resistor 34 for stably operating the operational amplifier is connected between the drain terminal and the gate terminal of the NMOS transistor 32.

The current-voltage converter 40 includes an NMOS transistor 41 and a resistor 42. With regard to the NMOS transistor 41, a gate terminal is connected to the gate terminal of the NMOS transistor 32 of the operational amplifier 20, and a source terminal is connected to the ground 17. A drain terminal of the NMOS transistor 41 is connected to one end of the resistor 42, and another end of the resistor 42 is connected to the positive electrode of the voltage supply 60. A connection point between the drain terminal of the NMOS transistor 41 and the resistor 42 is connected to an output terminal 43.

In the current detection device of the above configuration, the current source 25 is connected to the drain terminal of the PMOS transistor 24 in the operational amplifier 20. The PMOS transistor 24 and the PMOS transistor 31 form a current mirror configuration, and therefore the drain current of the PMOS transistor 31 is a constant current that is greater than, and proportional to, the current source 25. On the other hand, as the gate voltage of the NMOS transistor 32, a voltage that is proportional to a difference between the voltage of the non-inverting input terminal 21 and the voltage of the inverting input terminal 22 is applied, in order to control the drain current of the NMOS transistor 32. As described above, what is called a class A amplifier is configured such that a high side of an output stage is used as a current source and a current of a low side is changed to adjust a current of the output stage. In this class A amplifier, current fluctuation that enters into the operational amplifier 20 from the output terminal 23 of the operational amplifier 20 flows in the NMOS transistor 32.

Here, when the power semiconductor element 10 is turned off, current does not flow in the sense IGBT 12, and thus in the output stage of the operational amplifier 20, the drain current of the PMOS transistor 31 flows as it is in the NMOS transistor 32. The operational amplifier 20 has a voltage follower configuration, and thereby the voltage of the reference voltage supply 50 which is applied to the non-inverting input terminal 21 is output as it is to the output terminal 23, and the emitter terminal 16 of the sense IGBT 12 is fixed to the voltage of the reference voltage supply 50.

In this case, in the current-voltage converter 40, the gate terminal of the NMOS transistor 41 is connected to the gate terminal of the NMOS transistor 32 of the operational amplifier 20, and therefore a current that is greater than, and proportional to, the current that flows in the NMOS transistor 32 flows in the NMOS transistor 41. This current flows in the resistor 42 to generate a voltage drop in the resistor 42, and is output from the output terminal 43.

Next, when the power semiconductor element 10 is turned on, the current of the sense IGBT 12 flows into the output terminal 23 of the operational amplifier 20. In the operational amplifier 20, the constant current from the PMOS transistor 31 and the current of the sense IGBT 12 flow in the NMOS transistor 32 of the output stage. In the NMOS transistor 32, the voltage between the gate and the source increases according to an increased current of the sense IGBT 12. Thereby, a current that is greater than, and proportional to, the current that flows in the NMOS transistor 32 flows in the NMOS transistor 41 of the current-voltage converter 40 as well, so as to increase the voltage drop in the resistor 42 as well. This change of voltage drop is observed by a circuit (not depicted) connected to the output terminal 43, in order to detect the current that flows in the IGBT 11.

According to this current detection device, the operational amplifier 20 fixes the emitter terminal 16 of the sense IGBT 12 to a voltage equal to or smaller than 1 volt, thereby causing little voltage changes between the gates and the emitters of the IGBT 11 and the sense IGBT 12 when the power semiconductor element 10 is turned on. Hence, accuracy of the current rate between the current that flows in the IGBT 11 and the current that flows in the sense IGBT 12 does not change, and thus high current detection accuracy can be maintained.

Also, the current-voltage converter 40 is provided, and its NMOS transistor 41 is configured to flow a current that is greater than, and proportional to, the current of the NMOS transistor 32 into which the current of the sense IGBT 12 flows, and the resistor 42 is provided at the high side of the NMOS transistor 41. Thereby, the resistor 42 is adjustable to an arbitrary value, and thus the resistance value of the resistor 42 can be set large in order to avoid influence of disturbance noise.

Further, this current detection device is configured to operate with reference to the electric potential of the ground 17 and thus it is not necessary to operate using a negative voltage, and thereby this current detection device is avoids complicated system design.

In the current detection device for the power semiconductor element, configured as above, the reference voltage supply, the operational amplifier, and the current-voltage converter operate with reference to the electric potential of the ground, and thereby have an advantageously simple configuration that does not require a negative voltage to operate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A current detection device for a power semiconductor element including a main element in which a main current flows and a current sense element for detecting the main current of the main element, the current detection device comprising:
    a reference voltage supply configured to output a predetermined reference voltage;
    an operational amplifier including a non-inverting input terminal, an inverting input terminal, and an output terminal, wherein
        the operational amplifier is connected to the reference voltage supply to receive the reference voltage at the non-inverting input terminal, and
        the inverting input terminal is connected to the output terminal and a current output terminal of the current sense element to fix an electric potential of the current output terminal of the current sense element to the voltage of the reference voltage supply received by the non-inverting input terminal of the operational amplifier; and
    a current-voltage converter configured to convert to voltage a current that is greater than and proportional to a current that flows directly from the current output terminal of the current sense element into the operational amplifier through the output terminal of the operational amplifier,
    wherein the reference voltage supply, the operational amplifier, and the current-voltage converter are configured to operate with reference to an electric potential of a ground.

2. The current detection device for the power semiconductor element according to claim 1, wherein
    the operational amplifier has, at an output stage thereof, a current source and an output stage device for adjusting current of the output stage, and
    a connection point between the current source and the output stage device is the output terminal of the operational amplifier.

3. The current detection device for the power semiconductor element according to claim 1, wherein the reference voltage supply has the reference voltage set at a voltage equal to or smaller than 1 volt.

4. The current detection device for the power semiconductor element according to claim 1, wherein the power semiconductor element is an insulated gate bipolar transistor.

5. The current detection device for the power semiconductor element according to claim 1, wherein
    each of the reference voltage supply, the operational amplifier, and the current-voltage converter is connected directly to the ground.

6. A power semiconductor system, comprising:
    a power semiconductor element comprising a main element through which a main current flows and a current sense element for detecting the main current of the main element; and
    a current detection device, comprising:
        a reference voltage supply configured to output a predetermined reference voltage;
        an operational amplifier including a non-inverting input terminal, an inverting input terminal, and an output terminal, wherein the operational amplifier is connected to the reference voltage supply to receive the reference voltage at the non-inverting input terminal, and the inverting input terminal is connected to the output terminal and a current output terminal of the current sense element to fix an electric potential of the current output terminal of the current sense element to the voltage of the reference voltage supply received by the non-inverting input terminal of the operational amplifier; and
        a current-voltage converter configured to convert to voltage a current that is greater than and proportional to a current that flows directly from the current output terminal of the current sense element into the operational amplifier through the output terminal of the operational amplifier,
    wherein the reference voltage supply, the operational amplifier, and the current-voltage converter are configured to operate with reference to an electric potential of a ground.

7. The power semiconductor system of claim 6, wherein the main element of the power semiconductor element is a first insulated-gate bipolar transistor (IGBT) and the current sense element is a second IGBT connected to the first IGBT, the second IGBT having a smaller size than the first IGBT.

8. The power semiconductor system of claim 6, wherein each of the reference voltage supply, the operational amplifier, and the current-voltage converter is connected directly to the ground.

* * * * *